United States Patent [19]
Schroeder

[11] 4,110,841
[45] Aug. 29, 1978

[54] LEVEL SHIFTER AND SENSE REFRESH DETECTOR

[75] Inventor: Paul Robert Schroeder, Dallas, Tex.

[73] Assignee: Bell Telephone Laboratories, Incorporated, Murray Hill, N.J.

[21] Appl. No.: 857,935

[22] Filed: Dec. 6, 1977

[51] Int. Cl.² .................................... G11C 7/00
[52] U.S. Cl. .................................... 365/205; 307/279; 307/DIG. 3; 365/154
[58] Field of Search .............. 365/154, 205; 307/279, 307/291, DIG. 3

[56] References Cited
U.S. PATENT DOCUMENTS 4,045,783  8/1977  Harland .................... 365/205

*Primary Examiner*—Stuart N. Hecker
*Attorney, Agent, or Firm*—Irwin Ostroff

[57] ABSTRACT

A low power high sensitivity detector having two pairs of cross coupled transistors and voltage equalization circuitry forms the basic configuration of a detector-level shifter circuit and a sense-refresh detector circuit which are both compatible with today's single chip large capacity MOS memories.

7 Claims, 2 Drawing Figures

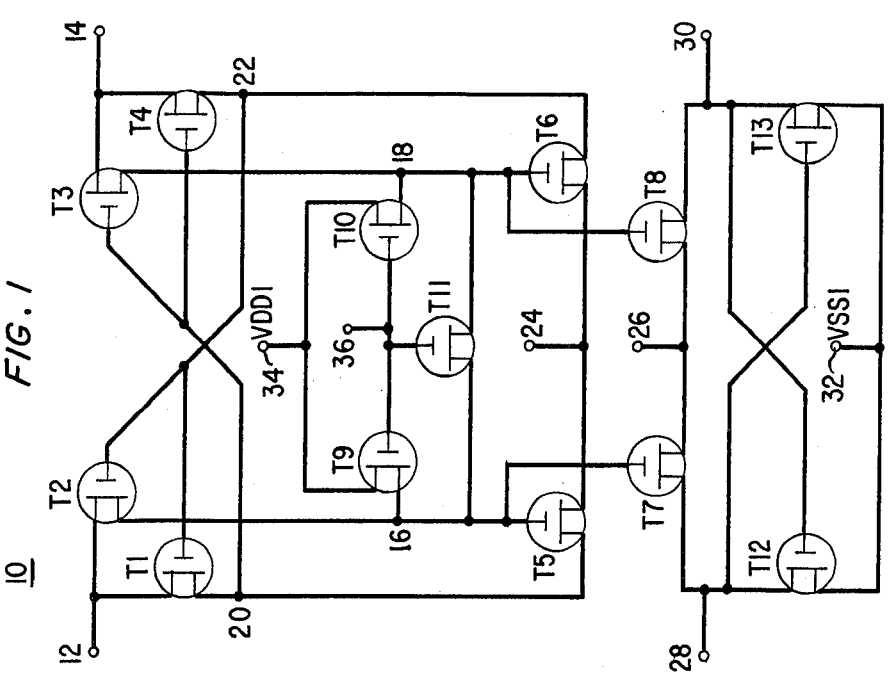

4,110,841

LEVEL SHIFTER AND SENSE REFRESH DETECTOR

BACKGROUND OF THE INVENTION

This invention relates to detector circuitry, and in particular, to low power high sensitivity MOS detector circuits.

Many of today's large capacity MOS dynamic memories require input buffers and sense-refresh detectors which have relatively low power dissipation and relatively high sensitivity. Typically, these memories use a basic memory cell which consists of an MOS transistor with a capacitor coupled to one of the output terminals. The ever increasing demand for greater and greater memory storage on a single chip has caused designers to decrease the size of the memory cell and thereby decrease the output signal therefrom. The reduction in the magnitude of the output signal level increases the need for higher sensitivity sense-refresh detectors. As the number of memory cells on a single integrated circuit chip increases, the number of sense-refresh detectors increases and power dissipation becomes increasingly important.

It would be desirable to have a basic detector which has relatively high sensitivity and low power dissipation, and which is capable of being fabricated on the same integrated circuit chip which contains the MOS memory cells.

SUMMARY OF THE INVENTION

The present invention is a detector circuit which essentially comprises first and second pairs of cross coupled switching devices T1, T2, T3, and T4, voltage equalization circuitry (which in a preferred embodiment comprises three switching devices, T9, T10, T11) and two additional switching devices T5 and T6. Each of T1, T2, T3, T4, T5, T6, T9, T10, and T11 comprises a control terminal and first and second output terminals.

The first output terminals of T1 and T2 are coupled together to a first circuit terminal. The first output terminals of T3 and T4 are coupled together to a second circuit terminal. The control terminals of T1 and T2 are coupled together to the second output terminals of T4 and T6. The control terminals of T3 and T4 are coupled together to the second output terminals of T1 and T5. The first output terminals of T5 and T6 are coupled together to a third circuit terminal. The second output terminal of T2 is coupled to the control terminal of T5, the second output terminal of T9, and the first output terminal of T11. The second output terminal of T3 is coupled to the control terminal of T6 and to the second output terminals of T10 and T11.

In one embodiment of the present invention, the basic detector discussed herein above is utilized with additional switching devices T7, T8, T12 and T13 to form an input detector level-shifter circuit. Each of T7, T8, T12 and T13 comprises a control terminal and first and second output terminals. The control terminals of T5 and T7 are coupled together and the control terminals of T6 and T8 are coupled together. The first output terminals of T7 and T8 are coupled together to a fourth circuit terminal. The second output terminal of T7 is coupled to a fifth circuit terminal, the control terminal of T13, and to the first output terminal of T12. The second output terminal of T8 is coupled to the control terminal of T12, the first output terminal of T13, and to a sixth circuit terminal. In this circuit embodiment the first and second terminals serve as input terminals and the fifth and sixth terminals serve as output terminals. A non-inverting output signal appears at the fifth terminal and an inverting output signal appears at the sixth terminal. In addition, this circuit also causes the input voltage level signals to be amplified (level shifted) such that typical TTL input signal levels are amplified to typical MOS signal levels.

Another embodiment of the invention comprises a sense-refresh detector which utilizes the configuration of switching devices T1 through T11 described above, and in addition, comprises switching devices T14, T15, T16, T17, T18, T19, T20 and T21, which each comprise a control terminal and first and second output terminals. The control terminal of T20 is coupled to the second output terminal of T4. The control terminal of T21 is coupled to the second output terminal of T1. The second output terminal of T20 is coupled to the control terminals of T14 and T17 and to the second output terminal of T7. The first output terminals of T16 and T17 are coupled together. The second output terminals of T16 and T17 are coupled together and are coupled to the second circuit terminal. The second output terminal of T21 is coupled to the control terminals of T15 and T18 and to the second output terminal of T8. The first output terminals of T18 and T19 are coupled together. The second output terminals of T18 and T19 are coupled together and are coupled to the first circuit terminal. The first output terminals of T14 and T15 are coupled to the first and second circuit terminals, respectively.

The first and second circuit terminals of the sense-refresh detector serve as input/output terminals. This sense-refresh detector detects the level of the input signal and causes that input terminal to be set to a potential level that causes a dynamic memory cell coupled thereto to be refreshed (rewritten) such that it contains the same logic information contained prior to a destructive read out operation.

The above discussed detector-level shifter circuit and sense-refresh detector circuit both operate dynamically and there is essentially no steady DC power dissipation and therefore, relatively low power dissipation. In addition, both circuits are characterized by relatively high input sensitivity.

These and other features and advantages of the invention will be better understood from consideration of the following detailed description taken in conjunction with the accompanying drawings.

BRIEF DESCRIPTION OF THE DRAWINGS

FIG. 1 illustrates a detector-level shifter circuit in accordance with the present invention; and FIG. 2 illustrates a sense-refresh detector circuit in accordance with the invention.

DETAILED DESCRIPTION

Referring now to FIG. 1 there is illustrated a detector-level shifter circuit 10 comprising field effect transistors T1 through T13. A field effect transistor whose gate is charged sufficiently to allow conduction between the drain and source will be denoted as enabled. Conversely, if the gate is not sufficiently charged to allow conduction, the transistor will be denoted as disabled.

The drains of T1 and T2 are connected together to terminal 12. The drains of T3 and T4 are connected together to terminal 14. The gates of T1 and T2 and the source of T4 are all connected together to terminal 22 and to the drain of T6. The gates of T3 and T4 and the source of T1 are connected to terminal 20 and to the drain of T5. The sources of T5 and T6 are connected together to terminal 24. The sources of T2 and T9, the drain of T11, and the gates of T5 and T7 are all connected together to terminal 16. The sources of T3, T10 and T11, and the gates of T6 and T8 are all connected together to terminal 18. The gates of T9, T10 and T11 are all connected together to terminal 36. The drains of T9 and T10 are connected to terminal 34 and to power supply VDD1. This configuration of T9, T10, and T11 serves as a voltage equalization circuit which essentially equalizes the potentials of terminals 16 and 18.

The sources of T7 and T8 are connected together to terminal 26. The drain of T7 is connected to terminal 28, the drain of T12, and to the gate of T13. The drain of T8 is connected to terminal 30, the gate of T12 and to the drain of T13. The sources of T12 and T13 are connected together to terminal 32 and to power supply VSS1.

Circuit 10 is useful as an input address buffer-level shifter circuit which may be used as part of a dynamic random access memory. Typically, dynamic n-channel random access memories receive TTL (transistor-transistor logic) voltage levels wherein a "0" signal level is typically plus 0.8 volts or less positive and a "1" signal level is typically plus 2.2 volts or more positive. A "1" or a "0" is applied to terminal 12 and a reference voltage, typically having a potential value midway between "1" and "0", is applied to terminal 14. For the "1" and "0" voltage levels described above, the reference potential level applied to terminal 14 is plus 1.5 volts. A non-inverting output signal appears at terminal 28 and an inverting output signal appears at terminal 30. With VSS1 equal to 0 volts and VDD1 equal to plus 12 volts the output "0" level is typically 0 volts (ground potential) and the "1" output level is typically plus 12 volts. These voltage levels are compatible with those used in many of today's n-channel dynamic MOS random access memories.

Initially terminals 24 and 26 are held at 0 volts and terminal 36 is held at plus 12 volts. The combination of T9, T10 and T11 is well known and serves to set the potentials at terminals 16 and 18 to essentially equal values of approximately plus 10 volts (assuming a transistor threshold voltage of 2 volts). The potentials of the gates of T5, T6, T7 and T8 are thus sufficiently positive such that all of these transistors are enabled. Terminals 20, 22, 28 and 30 are thus all discharged through enabled transistors T5, T6, T7 and T8, respectively, to essentially 0 volts. Terminal 36 is now pulsed to 0 volts and terminals 16 and 18 hold the previously set potentials as charge on the parasitic capacitances (not illustrated) associated with these terminals and transistors connected thereto.

Assume that a "0" input signal of approximately 0 volts is now applied to terminal 12 and a reference voltage of typically plus 1.5 volts is applied to terminal 14. Terminal 24 is now pulsed from ground potential to plus 12 volts. T5 and T6, which are enabled, both begin to conduct and terminals 20 and 22 both start to rise in potential. Terminals 16 and 18 increase in potential because of voltage bootstrapping due to the capacitances of the gates of T5 and T6 parasitic capacitance between terminal 24 and terminals 16 and 18. T1 and T2 become enabled and conduct before T3 and T4 because terminal 12 is at a lower potential than terminal 14. This causes terminal 16 to discharge through enabled T2 towards the 0 volt potential applied to terminal 12. This causes T5 to become less enabled and to act as a greater impedance and thus tends to limit the positive increase in potential of terminal 20. This in turn keeps T3 and T4 disabled and thus allows terminal 22 to continue to charge towards plus 12 volts through enabled T6. This maintains T1 and T2 enabled and thus allows terminal 16 to be discharged towards 0 volts while terminal 18 remains relatively undischarged. The above condition disables T5 and thereby cuts off all conduction therethrough. Terminal 20 also discharges through enabled T1 to the 0 volt potential of terminal 12. This condition insures that T3 and T4 stay disabled.

T6 remains enabled and terminal 22 is held at approximately plus 12 volts. There is essentially no DC flow of current through T1-T13 at this point in time.

Thus at this point, terminals 16 and 18, which started out at equal potentials, have developed a voltage differential of several volts; terminals 20 and 22, which started at 0 volts, have also developed a differential voltage of several volts.

It is to be noted that the combination of T1 through T6 and the voltage equalization circuitry, which comprises T9, T10, and T11 (or some other suitable combination), is in itself useful as a detector circuit with terminals 12 and 14 serving as inputs and terminals 20 and 22 serving as outputs.

Terminal 26 is then pulsed from 0 volts to plus 12 volts. T8 is enabled and thus terminal 30 rises in potential from 0 volts towards plus 12 volts. The potential of the gate of T8 is bootstrapped up to typically one threshold voltage above plus 12 volts due to gate capacitances and the parasitic capacitance (not illustrated) between terminals 26 and 18. Thus the entire plus 12 volts applied to terminal 26 appears at terminal 30. This enables T12 which then holds terminal 28 at 0 volts (the potential of VSS1). Thus for a "0" input voltage level of 0 volts there occurs a "1" output signal level of plus 12 volts at terminal 30 (which serves as the detector-shifter circuit inverter output terminal), and a "0" output signal level of 0 volts at terminal 28 (which serves as an inverting output terminal). The output voltage levels of plus 12 volts and 0 volts are typical "1" and "0" levels of an n-channel field effect transistor dynamic random access memory system with which circuit 10 can be used.

If a "1" is applied to terminal 12 then terminal 28 assumes the "1" output signal level and terminal 30 assumes the "0" output signal level.

It is to be noted that during the entire operation of circuit 10 there is no steady-state DC current flow and therefore, power dissipation is kept relatively low. Also, high sensitivity is achieved because the voltage equalization circuitry acts to selectively equalize the potentials of terminals 16 and 18.

Referring now to FIG. 2 there is illustrated a sense-refresh detector circuit 37 comprising field effect transistors T1 through T21. The basic configuration of transistors T1 through T11 of FIG. 1 is used as part of sense-refresh detector circuit 37. The basic operation of transistors T1 through T11 of the sense-refresh detector circuit 37 of FIG. 2 is essentially the same as transistors T1–T11 of the detector level-shifter circuit 10 of FIG. 1.

The gates of T20 and T21 are connected to terminals 22 and 20, respectively. The drains of T20 and T21 are both connected to terminal 42 and to power supply VRR. The source of T20 and the gates T14 and T17 are all connected to terminal 28' and to the drain of T7. The source of T21 and the gates of T15 and T18 are all connected to terminal 30' and to the drain of T8. The sources of T16, T17, T18 and T19 are all connected together to terminal 40 and to power supply VRR. The drains of T16 and T17 and the source of T15 are connected to terminal 14. The drains of T18 and T19 and the source of T14 are all connected to terminal 12. The drains of T14 and T15 are connected to terminal 38 and to power supply VDD2. The gates of T16 and T19 are both connected to terminal 36.

The sense-refresh detector 37 is particularly useful with many of today's large capacity MOS dynamic memories which utilize a memory cell comprising a single transistor and capacitor. To write a "1" into an n-channel memory cell of this type, the word line, which is connected to the gate of the transistor, is pulsed to a high level, and the bit line, which is connected to the source of the transistor, is also pulsed to the high level. The transistor of the memory cell is then enabled and thus the potential of the bit line is transferred to the capacitor minus the threshold voltage of the transistor. For example, if plus 12 volts is applied to both the word line and bit line of a particular memory cell, the capacitance of that cell charges to approximately 10 volts (assuming a transistor threshold voltage of two volts). A "0" is typically written into the cell by applying a low voltage level, typically 1.5 volts, to the bit line and plus 12 volts to the word line. This causes the transistor of the memory cell to become enabled and for the capacitance thereof to assume the 1.5 volt potential level.

To read out logic information stored in the memory cell, the bit line associated therewith is first precharged in potential to 1.5 volts and allowed to float at that potential. The capacitance associated with the bit line holds the potential thereof at 1.5 volts. The word line connected to the gate of the memory cell transistor is then pulsed to typically plus 12 volts. If the cell stores a "1" the charge on the capacitor of the cell discharges into the bit line and increases the bit line potential to typically plus 2.5 volts. The change in potential of the bit line is a function of the ratio of the capacitance of the memory cell to that of the bit line. If the cell stores a "0" there is essentially no change in the potential of the bit line when the transistor of the memory cell is enabled.

The read out operation is destructive in that logic information stored in the memory cell as a function of the potential of the capacitor thereof is destroyed during a read out operation. Thus, after information is read out of a memory cell, the cell must be rewritten (refreshed) to the same memory state it had prior to the read out operation. This means that after a "1" is read out of a cell the bit line must be set to plus 12 volts, and conversely, if a "0" is read out, the bit line must be set to plus 1.5 volts.

The sense-refresh amplifier 37 of FIG. 2 senses logic information on terminals 12 or 14 using transistor T1 through T11 and then thereafter, automatically using transistors T14-T21, refreshes a memory cell (not illustrated) connected to terminals 12 or 14 to the proper potential value to refresh the memory cell whose stored logic information is destroyed during read out.

If it is desired to read out and refresh logic information from a memory cell (not illustrated) connected to a bit line (not illustrated) which is connected to terminal 12, terminal 14 is initially set to a potential level which is midway between that value that a stored "1" and a stored "0" would cause terminal 12 or 14 to assume (typically plus 2.0 volts). Conversely, if a memory cell is connected to terminal 14 then terminal 12 is set to the mid-potential level.

In operation initially terminal 36 is initially held at plus 12 volts and terminals 24 and 26 are held at 0 volts. This enables T9, T10, T11, T16 and T19 and causes terminals 12 and 14 to charge to the voltage potential VRR through enabled transistors T19, and T16, respectively. It also causes terminals 16 and 18 to assume essentially equal potentials of plus 10 volts (assuming VDD1 equals plus 12 volts and one threshold voltage is approximately 2 volts). This condition enables T5, T6, T7 and T8 and consequently discharges terminals 20, 22, 28' and 30' to essentially 0 volts.

Terminal 36 is then pulsed to 0 volts and terminals 16, 18, 12, 14, 28' and 30' remain floating in potential at the values previously set. The parasitic capacitances (not illustrated) associated with these terminals and the transistors connected thereto hold them at the potentials previously set. Now logic information from a memory cell (not illustrated) is read out of the memory cell onto a bit line (not illustrated) coupled to terminal 12. If a "0" is stored in the memory cell then terminal 12 assumes (stays at) the approximate potential of plus 1.5 volts. Terminal 14 is set in potential to a value of approximately plus 2.0 volts. If the memory cell had contained "1" then terminal 12 assumes a potential of approximately plus 2.5 volts.

Terminal 24 is now pulsed from ground potential to plus 12 volts. T1 and T2 begin to become enabled and conduct before T3 and T4 because terminal 12 is at a lower potential than terminal 14. This causes terminal 16 to discharge through enabled T2 toward the plus 1.5 volt potential of terminal 12. This causes T5 to become less enabled and to act as a greater impedance than previously, and thus limits the positive potential increase of terminal 20. This in turn tends to keep T3 and T4 disabled and thus allows terminal 22 to continue to charge plus 12 volts through enabled T6. This in turn maintains T1 and T2 enabled and thus allows terminal 16 to be discharged further towards 1.5 volts while terminal 18 is still charged essentially to +10 volts or a somewhat more positive potential. This disables T5 and thereby cuts off conduction therethrough. Terminal 20 can now discharge through enabled T1 the 1.5 volt potential of terminal 12. This further insures that T3 and T4 stay disabled. T20 is also enabled and keeps terminal 28' at approximately VRR (typically plus 1.5 volts). This maintains T14 disabled. The initial imbalance in voltage between terminals 12 and 14 has been amplified at terminals 16 and 18 and at terminals 20 and 22 at this point in time.

Now terminal 26 is pulsed from 0 volts to plus 12 volts. T8 is enabled and thus terminal 30' rises in potential from approximately 0 volts plus 12 volts. This enables T15 which causes terminal 14 to charge to VDD2 minus the threshold voltage of T15 (to a value of typically plus 10 volts). It also enables T18. This in turn causes terminal 12 to be held in potential at VRR (typically 1.5 volts). Since T7 is disabled, terminal 28' continues to be held in potential at VRR by enabled T20. Thus T14 and T17 are maintained disabled.

It is thus apparent that with a "0" level input signal applied to terminal 12 that a corresponding "0" level (the potential of VRR) signal appears at terminal 28' and that a corresponding "1" level signal appears at terminal 30'. The potentials applied to terminals 28' and 30' control the potential levels that are rewritten into a memory cell coupled to terminals 12 and 14 in such a way as to rewrite (refresh) the stored information that is destructively read out of the memory cell. Thus the "0" input signal originally applied to terminal 12 is maintained by T18 and fed back to terminal 12 via T18 so as to refresh the memory cell with a potential which causes it to regain the "0" previously stored. Conversely, if a "1" input signal is applied to terminal 12 the appropriate potential necessary to rewrite a "1" is automatically applied to terminal 12 via T14. At the end of an operating cycle of circuit 37, terminals 24 and 26 are pulsed from plus 12 volts back to 0 volts and terminal 36 is pulsed from 0 volts back to plus 12 volts.

It is to be noted that there are no steady-state DC paths of current between any of the power supplies used with the sense refresh amplifier 37. Thus, only dynamic current paths exist and power dissipation is kept relatively low. Also, high sensitivity is achieved because the voltage equalization circuitry acts to selectively equalize the potentials of terminals 16 and 18.

The detector-level shifter circuit 10 and the sense-refresh circuit 37 have been fabricated in integrated circuit form as part of a 4096 bit n-channel dynamic random access memory and have been found to be functional.

It is to be understood that the embodiments described herein are merely illustrative of the general principles of the invention. Various modifications are possible within the scope of the invention. For example, p-channel MOS transistors can be substituted for the n-channel MOS transistor providing all appropriate voltages are adjusted. Still further, T11 can be eliminated and other voltage equalization circuitry can be used.

What is claimed is:

1. Circuit means comprising:
    first, second, third, fourth, fifth, and sixth switching devices (T1, T2, T3, T4, T5, and T6) which each comprise a control terminal and first and second output terminals;
    voltage equalization circuit means;
    the first output terminals of T1 and T2 being coupled together to a first input circuit terminal, the control terminals of T1 and T2 being coupled together to the second output terminals of T4 and T6, the second output terminal of T2 being coupled to the control terminal of T5 and to the voltage equalization circuit means;
    the first output terminals of T3 and T4 being coupled together to a second circuit terminal, the control terminals of T3 and T4 being coupled to the second output terminals of T1 and T5, the second output terminal of T3 being coupled to the voltage equalization circuit means and to the control terminal of T6; and
    the first output terminals of T5 and T6 being coupled to a third circuit terminal.

2. The apparatus of claim 1 further comprising:
    switching devices T7 and T8 which each comprise a control terminal and first and second output terminals;
    the first output terminals of T7 and T8 being coupled to a fourth circuit terminal;
    the control terminals of T5 and T7 being coupled together; and
    the control terminals of T6 and T8 being coupled together.

3. The apparatus of claim 2 further comprising:
    switching devices T12 and T13 which each comprise a control terminal and first and second output terminals;
    the control terminal of T13 being coupled to the second output terminal of T7, the first output terminal of T12, and to a fifth circuit terminal; and
    the control terminal of T12 being coupled to the second output terminal of T8, the first output terminal of T13 and to a sixth circuit terminal.

4. The apparatus of claim 3 wherein all the switching devices are MOS transistors.

5. The apparatus of claim 2 further comprising:
    switching devices T14, T15, T16, T17, T18, T19, T20, and T21 which each comprise a control terminal and first and second output terminals;
    the control terminal of T20 being coupled to the second output terminal of T4;
    the second output terminal of T20 being coupled to the second output terminal of T7 and to the control terminals of T14 and T17;
    the first output terminal of T14 being coupled to the first circuit terminal;
    the first output terminals of T16 and T17 being coupled together;
    the second output terminals of T16 and T17 being coupled together and being coupled to the second circuit terminal;
    the control terminal of T21 being coupled to the second terminal of T1;
    the second output terminal of T21 being coupled to the second output terminal of T8 and to the control terminals of T15 and T18;
    the first output terminals of T18 and T19 being coupled together;
    the second output terminals of T18 and T19 being coupled together and being coupled to the first circuit terminal;
    the first output terminal of T15 being coupled to the second circuit terminal; and
    the first and second circuit terminals serving as input/output terminals of the circuit.

6. The apparatus of claim 2 wherein the voltage equalization circuitry comprises:
    switching devices T9, T10, and T11 which each comprise a control terminal and first and second output terminals;
    the control terminals of T9, T10 and T11 all being coupled together;
    the first output terminal of T9 and T10 being coupled together;
    the first output terminal of T11 and the second output terminals of T9 both being coupled to the control terminal of T5; and
    the second output terminals of T10 and T11 both being coupled to the control terminal of T6.

7. The apparatus of claim 6 wherein all the switching devices are MOS transistors.

* * * * *